United States Patent [19]

Conant et al.

[11] 4,255,216
[45] Mar. 10, 1981

[54] PELLICLE RING REMOVAL METHOD AND TOOL

[75] Inventors: Jay W. Conant, Richmond; Donald W. Fisher, Colchester; David D. Fox, Milton, all of Vt.

[73] Assignee: International Business Machines Corporation, Armonk, N.Y.

[21] Appl. No.: 111,749

[22] Filed: Jan. 14, 1980

[51] Int. Cl.³ .............................................. B32B 31/24
[52] U.S. Cl. ........................................ 156/80; 156/254; 156/344; 156/498; 156/584; 225/1; 225/93.5; 264/28; 428/913
[58] Field of Search .................. 156/80, 254, 344, 498, 156/584; 220/901; 225/1, 93.5; 264/28; 428/913

[56] References Cited

U.S. PATENT DOCUMENTS

| | | | |
|---|---|---|---|
| 3,670,917 | 6/1972 | Nishimaki et al. | 220/901 X |
| 3,769,118 | 10/1973 | Tariel et al. | 156/71 |
| 3,792,989 | 2/1974 | Dahlberg et al. | 225/93.5 X |
| 3,802,948 | 4/1974 | Noma | 428/320 X |
| 3,878,978 | 4/1975 | Martinek | 225/1 |
| 3,936,922 | 2/1976 | Blackstone et al. | 225/93.5 X |
| 4,131,363 | 12/1978 | Shea et al. | 355/75 |

*Primary Examiner*—John T. Goolkasian
*Assistant Examiner*—Robert A. Dawson
*Attorney, Agent, or Firm*—Francis J. Thornton

[57] ABSTRACT

The invention discloses a method of separating a glass mask from a pellicle ring adhesively mounted thereon. This is accomplished by maintaining a coolant in contact with the mask for a period of time sufficient to cool the adhesive bond between the mask and pellicle ring to below its embrittlement temperature so that when a shearing force is applied to the ring with respect to the glass mask will cause shearing of the adhesive bond at the adhesive glass mask interface. When pressure is applied to the ring across the adhesive, separation at the surface of the mask occurs and the ring is released from the mask without damage to the mask or the ring and without leaving significant amounts of adhesive on the surface of the mask. Pellicles removed in this manner can be rebonded at a later time to a glass mask using the same adhesive and without using additional adhesive.

9 Claims, 3 Drawing Figures

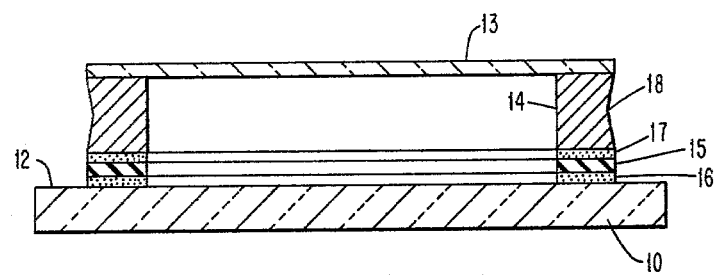
FIG. 1
FIG. 2
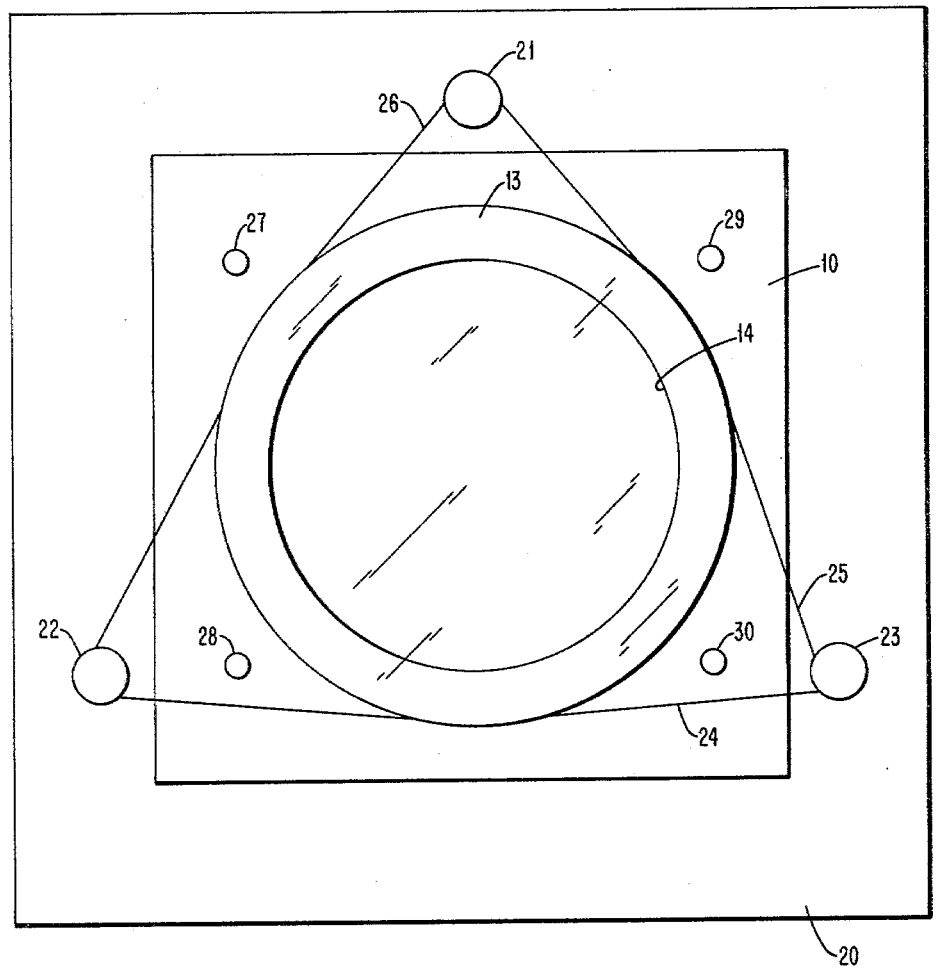

PELLICLE RING REMOVAL METHOD AND TOOL

BACKGROUND OF THE INVENTION

This invention relates generally to pattern mask structures for projection printing systems which uses a pellicle structure to avoid the printing of contamination particles and more particularly to a method and a tool for removing such pellicle structure from the masks without damaging either the pellicle, its support or the mask.

In the manufacturing of integrated circuits various mask elements having desired opaque patterns thereon are widely used. Dirt pickup and physical damage to the mask resulting from a contact between the mask and the substrate require replacement of the mask on a regular basis. To reduce the incidence of replacement and to improve the life of the mask, improved projection printing masks are now being provided with covers, i.e., pellicles. These pellicles are a transparent film spaced apart from the opaque pattern on the mask such that the pattern is protected from dirt and damage and the images of the dirt particles on the outer surface of the pellicles are maintained out of focus during the projection printing of the opaque surfaces on the mask. Such pellicles are disclosed and claimed in U.S. Pat. No. 4,131,363 issued on Dec. 26, 1978, to V. Shea et al. and assigned to the same assignee as the present invention.

During final inspection of such pellicle mounted masks it is sometimes found that dust particles have been trapped between the pellicle and the mask or that there is a defect in the mask requiring that the pellicle supporting ring, on which the pellicle is mounted to be removed so that the mask can either be recleaned or otherwise corrected.

In the past the removal of the pellicle and its supporting ring either caused extensive damage to the pellicle supporting ring or else damaged the mask to the point where it could not be salvaged or left large amounts of adhesive residue on the mask requiring lengthy uneconomical cleaning steps.

We have now found an improvement for removing such pellicle supporting rings from the glass mask without damaging either the pellicles, the pellicle supporting ring or the mask and without leaving significant amounts of adhesive residue on the mask, thus eliminating the lengthy uneconomical cleaning steps known to the prior art.

BRIEF SUMMARY OF THE INVENTION

In accordance with the invention there is provided a method of removing adhesively held pellicle rings from a glass mask without damaging the pellicle, the pellicle supporting ring or the mask and without leaving any significant amounts of adhesive residue on the mask and that this removal does not interfere with the rebonding of the pellicle ring to the mask once the mask has been corrected or cleaned.

The present invention also discloses an apparatus for accomplishing this removal in a quick and easy manner.

DESCRIPTION OF THE DRAWINGS

FIG. 1 is a sectional view of a mask with a pellicle mounted thereon.

FIG. 2 is a top view of a portion of the apparatus for removing the pellicle supporting ring from the mask in accordance with the present invention.

SUMMARY OF THE INVENTION

Figure 3:
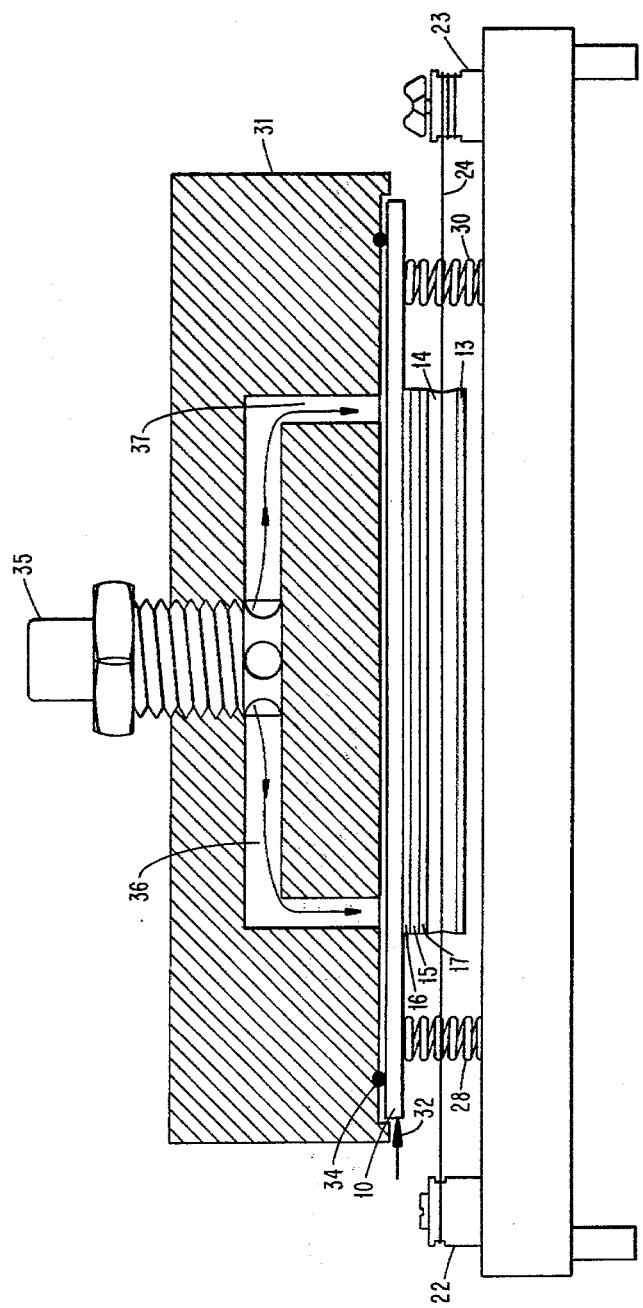
FIG. 3 is a sectional view of the apparatus for removing the pellicle support ring from the mask in accordance with the present invention.

The invention discloses a method of separating a glass mask from a pellicle ring adhesively mounted thereon. This is accomplished by maintaining a coolant in contact with the mask for a period of time sufficient to cool the adhesive bond between the mask and pellicle ring to below its embrittlement temperature so that when a shearing force is applied to the ring with respect to the glass mask will cause shearing of the adhesive bond at the adhesive glass mask interface. When pressure is applied to the ring across the adhesive, separation at the surface of the mask occurs and the ring is released from the mask without damage to the mask or the ring and without leaving significant amounts of adhesive on the surface of the mask. Pellicles removed in this manner can be rebonded at a later time to a glass mask using the same adhesive and without using additional adhesive.

DETAILED DESCRIPTION OF THE INVENTION

FIG. 1 shows a mask 10 constructed from a glass substrate and having a pattern of opaque areas on its surface 12. On the same surface 12 over these opaque areas there is provided a pellicle 13 which is spaced from the surface 12 by a pellicle support ring 14 which is bonded to the surface 12. This pellicle 13 consists of a thin transparent film stretched over and bonded to the pellicle support ring 14. The pellicle 13 generally is as transparent as the glass substrate 10 and should have a thickness of approximately 6 microns so that it does not substantially effect the optical path of light being passed through the mask by an optical projection system (not shown).

The use of a thin pellicle thus avoids the need to compensate for the presence of the pellicle when the mask and the pellicle combination is placed in a projection system. Pellicle materials are usually polymer filsm such as polyethylene terephthalate, sold under the trademark MYLAR, nitrocellulouse or parylene. If desired anti-reflective coatings can be placed on the film to reduce any effects in the projection system. The thickness of the pellicle support ring which separates or spaces the pellicle from the mask is varied in accordance with the size of the dirt particles that are expected in the environment in which the mask is to be used. Thus, for instance, when the expected size of the dirt particles is approximately 30 millimicrons the thickness of the pellicle support ring should be approximately 4 millimeters.

The pellicle support ring 14 is generally metallic, i.e., aluminum but could also be plastic. This pellicle support ring 14 is bonded to the glass mask 10 with an adhesive. This adhesive can be any pressure sensitive or heat or solvent activated adhesive such as rigid acrylic, epoxy, cyanoacrylate or polyester material. Preferably as shown in FIG. 1 a foam ring 15 having such pressure sensitive adhesive layers 16 and 17 on each side is used to bond the support ring 14 to the glass mask 10. Thus the foam 15 is sandwiched in the adhesive between the glass surface 12 and the aluminum ring 14 and can be formed, for example, of neoprene, pvc, polyurethane or a polyester. Generally speaking any foam capable of becoming rigid when cooled to the adhesive embrittlement temperature is suitable. Further, any adhesive that is capable of embrittlement by cooling is suitable for the present invention.

The above described adhesives which are commonly used for bonding metallic bodies to glass bodies generally have such a high bonding force with the glass that when an attempt is made to mechanically separate the metallic layer from the glass breakage occurs in the adhesive itself rather than at the glass adhesive interface which causes a significant amount of adhesive to remain on the glass surface. Instead of breakage occurring within the adhesive itself sometimes breakage occurs within the glass which causes the glass to be totally unuseable.

Because of this high mechanical bonding force between the adhesive and the glass it was found in the past to be uneconomical to remove such pellicle support rings because of the damage to the glass or the increased cleaning problems necessitated by attempting to remove the adhesive that remained bonded to the glass.

FIGS. 2 and 3 illustrate the apparatus used to accomplish the present invention and thus removed the pellicle support ring from the glass mask without leaving either significant amounts of adhesive on the glass which would interfere with correction or cleaning of the glass and which prevents damage to the glass. Further the present invention accomplishes such a removal without adversely affecting the adhesive and permits the salvaged pellicle and pellicle support ring to be rebonded to the same cleaned mask or any other mask without providing additional adhesive material.

The apparatus of the invention includes a base plate 20 on which there is mounted three equally spaced wire holders 21, 22 and 23 having stainless steel wires 24, 25 and 26 stretched therebetween to form a generally triangular enclosed space. The mask 10 whose supporting ring 14 is to be removed is located over the base with the pellicle support ring 14 positioned between these wires 24, 25 and 26. Tension is applied to the wires 24 and 25 by the adjustable holder 23. The wire 26 is permanently fixed between the holders 22 and 21. To assure that the support ring 14 is tightly held between the wires it is provided with a V-shaped groove 18 on its outer side and the wires 24, 25 and 26 are located in this groove. Thus the ring is tightly held by the wires. In place of the wires 24, 25 and 26 a multiplicity of mechanical fingers which extend from a number of fixed ring locators could be used. Such fingers would be spring loaded to apply a force across, i.e. normal to the bonded surface, to apply a separation force to the mask and ring once the bond is embrittled and sheared.

A number of springs 27, 28, 29 and 30 are positioned around the ring 14 so that a positive bias is applied across, i.e. normal to, the bond between the ring 14 and the glass mask 10. By so biasing the mask 10 away from the plate 20 while holding the pellicle support ring 14 firmly in the enclosing wires a positive separation of the ring from the mask is assured once the bond has broken and assures that rebonding does not occur.

An apertured gas head 31 completes the basic apparatus and is placed over the mask 10 opposite to the pellicle support ring 14 which is to be removed. If necessary an O ring 34 can be used to provide a seal between the glass mask 10 and the head 31. The head 31 is further provided with a central input 35 which connects with a series of radial spokes 36 radiating outwith from the central input 35 and connecting to a channel 37 which is in the form of the ring and which is positioned over and the same size as the pellicle ring which is to be removed.

A coolant fluid, such as, for example, liquid nitrogen or nitrogen gas cooled by liquid nitrogen, which will chill the glass plate 10 to at least the embrittlement temperature of the adhesive which for most acrylic adhesives is between $-70°$ C. and $-120°$ C. is introduced through the input port 35 into the radiating spokes 36 and thus the ring cavity 37. This coolant fluid as it enters the channel 37 contacts the glass mask immediately opposite to the bonded pellicle supporting ring and chills the glass mask and the adhesive bond between the mask and the pellicle ring to below the embrittlement temperature of the adhesive and causes contractions between the pellicle supporting ring 14 and the glass mask 10. These contractions aid in shearing the embrittled adhesive from the glass plate at the adhesive-glass interface because the adhesive contracts at approximately the same rate as the aluminum frame and much faster than the glass. Thus shearing occurs only at the embrittled adhesive glass interface and does not occur at the aluminum frame adhesive interface. The springs 27, 28, 29 and 30 applying a biasing force to the glass mask with respect to the frame assures that when the shearing occurs and the glass adhesive bond is broken that the ring is pulled free of the glass.

If desired, positive shearing of the bond at the glass adhesive interface can be assured by applying a shearing force, as indicated by arrow 32 to the glass mask, parallel to the glass-adhesive interface. If desired this force could also be applied to the interface itself. Also a single wedged tool could be used to apply both a shearing and a separating force to this interface.

This shearing of the bond takes approximately two minutes when nitrogen gas cooled by liquid nitrogen is used and the pellicle ring is approximately $3\frac{1}{2}$ inches in diameter.

This removal of the embrittled adhesive permits the mask to be now cleaned or corrected and does not substantially effect the adhesive in any way. In fact once the adhesive is permitted to warm up to room temperature it again regains its adhesive qualities and can be again mounted onto the glass mask without any substantial reduction in its adhesive power. Thus, not only is the item easily removed from the glass mask without leaving adhesive residue on the mask but further can be reused without requiring a new adhesive on the pellicle support itself.

While the invention has been particularly described with respect to a preferred embodiment, it should be understood by one skilled in the art that the foregoing or other changes in form and detail may be made therein without departing from the spirit and scope of the invention.

What is claimed:

1. A method of separating two workpieces adhesively bonded together with a layer of adhesive which is embrittled at a temperature below zero degrees centigrade, one of the workpieces and the adhesive having a coefficient of expansion substantially greater then the other of said workpieces comprising the steps of;

fixedly holding the workpiece with the higher coefficient of expansion, applying a coolant only to the side of the workpiece having the smaller coefficient of expansion opposite the adhesive layer, maintaining the coolant in contact with the workpiece having the smaller coefficient of expansion for a period of time sufficient to cool the adhesive layer to below its embrittlement temperature and to shear the adhesive layer at its interface with the workpiece having the smaller coefficient of expansion, and applying a separating force to the workpieces to separate the workpieces at the interface at which the embrittled adhesive layer is sheared.

2. The method of claim 1 wherein the coolant has a temperature between −70° C. and 120° C.

3. The method of claim 1 wherein one of said workpieces is comprised of glass and the other of said workpieces is comprised of aluminum.

4. The method of claim 3 wherein the adhesive comprises an acrylic.

5. The method of claim 4 wherein said coolant comprises liquid nitrogen.

6. The method of claim 4 wherein said coolant comprises a gas cooled by liquid nitrogen.

7. The method of claim 1 wherein there is further provided the step of;

applying an external shearing force to the workpiece having the smaller coefficient of expansion and parallel to the embrittled adhesive layer.

8. A tool for separating two workpieces bonded together by a layer of adhesive comprising means for holding in a fixed position a first one of said workpieces, means for applying a coolant fluid only to the side of the second of said workpieces opposite to said first workpiece for a period of time to embrittle and shear the adhesive layer bonding together said workpieces, and means for applying a force to said second workpiece normal to said adhesive layer to separate said workpieces when said adhesive layer is embrittled.

9. The tool of claim 8 wherein there is further provided means for applying a shearing force to said second workpiece parallel to the said adhesive layer between the workpieces.

* * * * *